United States Patent [19]

Johnson et al.

[11] 4,240,032
[45] Dec. 16, 1980

[54] TRANSPORTING AND ORIENTING AN ARTICLE USING A MOVABLE CARRIER INSERTED INTO AN INDENTATION IN THE ARTICLE

[75] Inventors: Everett C. Johnson, Sinking Springs; Arthur G. Naylor, Wyomissing, both of Pa.

[73] Assignee: Western Electric Company, Inc., New York, N.Y.

[21] Appl. No.: 847,279

[22] Filed: Oct. 31, 1977

[51] Int. Cl.³ .................... G01R 31/02; G01R 31/22; B65G 47/24
[52] U.S. Cl. .............................. 324/158 F; 198/394; 324/73 AT
[58] Field of Search ............... 198/388, 394, 477, 678, 198/680; 324/158 F, 73 AT; 209/573, 539, 540

[56] References Cited

U.S. PATENT DOCUMENTS

| | | | |
|---|---|---|---|
| 907,116 | 12/1908 | Baker | 198/410 |
| 1,073,907 | 9/1913 | Kelso | 198/477 |
| 2,643,761 | 6/1953 | Wagner et al. | 198/477 |
| 3,109,530 | 11/1963 | McPherson | 198/394 |
| 3,144,740 | 8/1964 | Erickson et al. | 53/48 |
| 3,774,021 | 11/1973 | Johnson | 313/499 |

Primary Examiner—Ernest F. Karlsen
Attorney, Agent, or Firm—G. W. Houseweart; R. Y. Peters

[57] ABSTRACT

In testing electronic devices having leads, difficulties are frequently encountered in transporting the devices to a test position and holding them securely while engaging the leads during testing. These difficulties are overcome in devices having an indentation in the body portion by engaging the indentation with a movable carrier pin. This pin pushes the device against a wall. In this position at least one lead of the device is arranged in a specific orientation with respect to the body portion. When the pin (and thereby the device) moves toward the test station, the lead contracts a ramp in its path. As the device continues to move, the lead travels up the ramp thereby pivoting the device into a position at approximately a right angle to the specific orientation upon the device reaching the top of the ramp. The lead is then engaged by a centering element which insures proper alignment for testing. After this alignment, the leads of the device are pressed by a plunger against the wall. A set of test contacts which are recessed in the wall then move outward from the wall to engage the leads.

9 Claims, 6 Drawing Figures

TRANSPORTING AND ORIENTING AN ARTICLE USING A MOVABLE CARRIER INSERTED INTO AN INDENTATION IN THE ARTICLE

BACKGROUND OF THE INVENTION

1. Field of the Invention

This invention relates generally to methods of and apparatus for transporting articles, and, more particularly, to methods of and apparatus for transporting and testing electronic devices having indentations in their body portions.

2. Description of the Prior Art

In manufacturing many types of electronic devices large-scale testing is often required to insure product quality. Due to various body configurations and the presence of delicate leads, such testing is sometimes difficult. But since many configurations have become relatively standardized, commercial test handlers are frequently available.

New problems in the testing area have arisen by the introduction of light-emitting diodes (LED's). Often these light-emitting diodes have body configurations which generally have not been previously encountered. An example of this is the light-emitting diode used in some telephone handsets. Such a light-emitting diode is shown in U.S. Pat. No. 3,774,021 issued to B. H. Johnson, and assigned to Bell Telephone Laboratories in an article by Alfred E. Bakanowski published in the *Bell Laboratories Record*, June 1977, pages 161–62. This particular diode has a cylindrical body portion formed of transparent epoxy which encapsulates a light-emitting semiconductor chip. A pair of fragile flat leads extend from the curved side of the device parallel to one another. An indentation in the body portion creates a "reflecting dimple" to allow for a better scattering of the light from the curved sidewalls of the diode.

Since the leads of the above-described light-emitting diode extend from the curved side of the body portion rather than the flat portion, conventional test handling equipment is generally not suitable for transporting and testing the diode.

Attempts have been made to test the diodes while they are in a rack with the leads hanging downward. However, it was found that it is extremely difficult to bring the leads into proper alignment with the test contacts in this position. Such alignment is necessary to obtain good testing contact for accurate measurements of the electrical parameters and light output of the diode.

SUMMARY OF THE INVENTION

It is, therefore, an object of the present invention to provide new and improved methods of and apparatus for transporting and orienting articles.

Another object of the present invention is to provide new and improved methods of and apparatus for transporting electronic devices to a predetermined orientation at a test station.

A further object of the present invention is to provide new and improved methods of and apparatus for transporting and testing a light-emitting diode having an indentation in the body portion.

With these and other objects in view, the present invention contemplates a new method of transporting and orienting an article having an indentation and at least one extending portion. The method includes placing a pin into an indentation of an article to hold the article movably against a substantially flat surface. The pin is then moved to slide the article along the surface. As the article moves, an extending portion of it comes into contact with an abutment mounted on the flat surface. Continued movement of the article causes it to pivot about the pin to position the article in a predetermined orientation in a predetermined location.

The invention further contemplates an apparatus for transporting such an article. Means are provided for placing a pin into the indentation of the article to hold it movably against a substantially flat surface. The flat surface has an abutment mounted thereon. Means are further provided for moving the pin to slide the article along the surface to contact the extending portion of the article with the abutment. As the pin continues to move, the article pivots about the pin to position it in a predetermined orientation in a predetermined location.

BRIEF DESCRIPTION OF THE DRAWING

Other objects and advantages of the present invention may be more clearly understood by reference to the following detailed description and drawing wherein.

DETAILED DESCRIPTION

Light-Emitting Diode

Figures 1, 2:
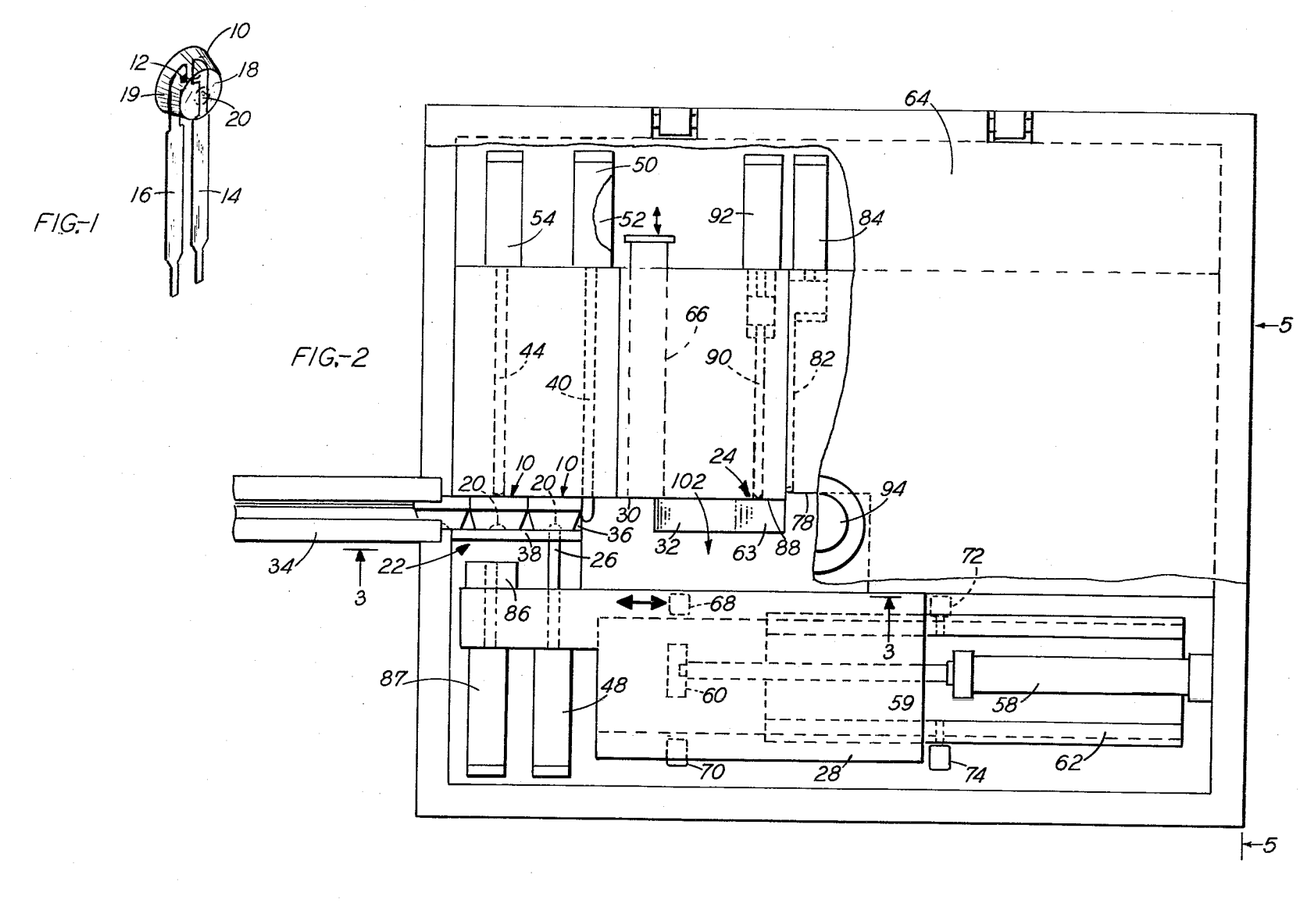
FIG. 1 is a perspective view of a light-emitting diode having an indentation in its body portion.
FIG. 2 is a plan view of the apparatus for transporting and testing the diode of FIG. 1 in accordance with the present invention.

Referring now to the drawing and, in particular to FIG. 1, an article is shown that may be transported and oriented in accordance with the present invention. This article may be a light-emitting diode 10. Such diode includes a light-emitting diode chip 12 coupled to a pair of parallel leads 14 and 16. The chip 12 and the upper portion of the leads 14 and 16 are encapsulated with a transparent insulating material to form the body portion 18. The leads 14 and 16 extend from a curved sidewall 19 of the body portion 18.

An indentation 20 is provided in the body portion 18. The indentation 20 allows light from the chip 12 to be internally reflected from it and through the curved sidewalls 19 of the body portion 18. In this manner the body portion 18 acts as a lens for the light from the chip 12. Such light-emitting diode 10 is further described in the aforementioned patent and article.

Overall Apparatus

FIG. 2 shows an overall view of an apparatus for transporting the diode 10 from a load station 22 to a test station 24. Basically, a carrier pin 26 mounted on a transfer table 28 is inserted into the indentation 20 of the diode 10. This presses the diode 10 against a wall 30. The leads 14 and 16 are arranged in a specific orientation at this time, as shown in dashed lines in FIG. 4. In this preferred embodiment these leads 14 and 16 hang approximately vertically downward, as viewed in FIG. 2.

The transfer table 28 is moved from the load station 22 to the test station 24. As it is so moved, it drags the diode 10 along the wall 30. The forward lead 14 strikes a ramp 32 mounted on the wall 30. This forces the lead 14 to rotate, pivoting the body portion 18 about the carrier pin 26. Upon the moving table 28 reaching its extreme right-ward position, the body portion 18 of the diode 10 pivots to approximately a right angle to the initial specific orientation and into the desired test position.

Loading Station

A feeding track 34 supplies a plurality of diodes 10 to the load station 22. This feed track 34 may be coupled to any source of the diodes 10, for example, a vibratory bowl (not shown). Generally the track 34 is higher at its input than at its output so that diodes 10 at the top force the lower diodes 10 along the track 34. Air jets (not shown) can also be used to assist in moving the diodes 10 along the track 34.

Upon arriving at the load station 22, the body portion 18 of the diode 10 rides along a ledge 36 of a plate 38. A pair of escapement pins 40 and 42 respectively abut the edge of the body portion 18 and the forward lead 14 to prevent the diode 10 from continuing into the test area.

Before the loading operation begins, a stack hold pin 44 presses the second diode 10 in line against the plate 38 preventing any further forward movement of the diode 10. The carrier pin 26 then extends through a slot 46 in the plate 38 to engage the indentation 20 of the body portion 18, thereby forcing the body portion 18 against the wall 30. At this point the diode 10 is ready to be advanced to the test station 24 once the escapement pins 40 and 42 are drawn back.

The various pins 26, 40, 42 and 44 are controlled respectively by air cylinders 48, 50, 52 and 54. As an example, the air cylinders may be Model SM-2 or SM-6 manufactured by the Clippard Corporation. The times and durations of the operation of the air cylinders are determined by the control circuit described hereinafter.

The pins 26, 40, 42 and 44 are conventionally spring-biased to return to a retracted position when they are not forced into their outward positions by air cylinders 48, 50, 52 and 54. Typically, the spring-biasing can be accomplished by springs (not shown) mounted internally in the cylinders 48, 50, 52 and 54.

Transferring Operation

Figure 3:
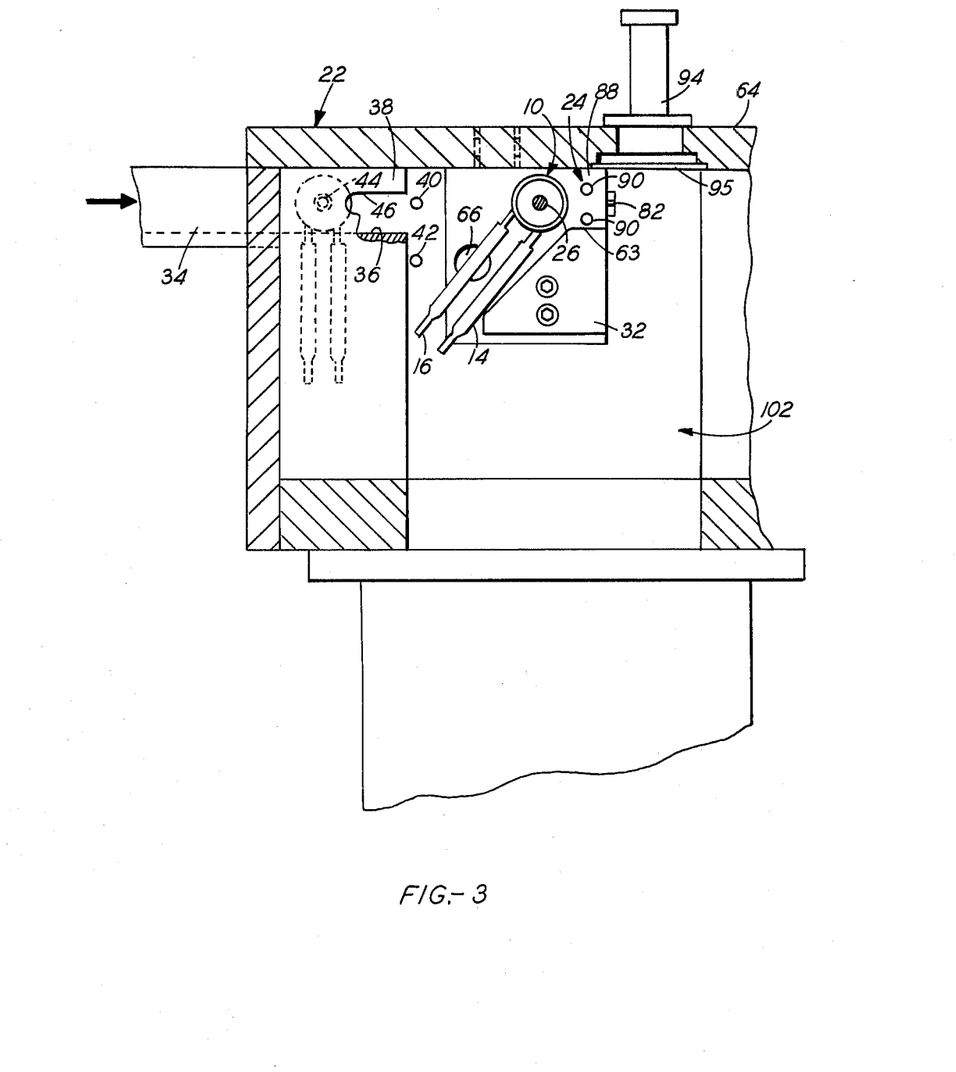
FIG. 3 is a front elevational view, taken along the lines 3—3 of FIG. 2, showing a diode being transferred to the test station according to the present invention.

Referring now to FIGS. 2 and 3, the movement of the diode 10 along the wall 30 after the escapement pins 40 and 42 have been drawn back is shown. The transfer table 28 is moved back and forth by a dual-acting air cylinder 58 having its shaft 59 fixed to an extension 60 of the transfer table 28. The dual-acting air cylinder 58 is also a conventional unit, for example, Model 3SD-1 manufactured by the Clippard Corporation. A guide track 62 is provided for the transfer table 28 to move along.

As the diode 10 travels along the wall 30, the forward lead 14 contacts the ramp 32. The body portion 18 continues to move along the wall 30, thereby pivoting about the carrier pin 26 as the lead 14 is swung upward along the ramp 32. This continues until the lead 14 reaches a position over the flattened top 63 of the ramp 32 at approximately a right angle to the initial position. A cover plate 64 prevents the leads 14 and 16 pivoting past the horizontal position.

A cylindrical pin 66 is normally recessed in the wall 30. This cylindrical pin 66 may be extended into the path of the forward lead 14 when the leads 14 and 16 are relatively short. Such short leads sometimes tend to swing toward the ramp 32 during their travel and strike it perpendicularly. In such a case the leads 14 and 16 would be bent out of shape rather than smoothly turning up the ramp 32. The cylindrical pin 66 prevents this by contacting the leads 14 and 16, near the body portion 18 shortly after the diodes 10 are moved away from the load station 22.

On the other hand, the cylindrical pin 66 is retracted for relatively long leads 14 and 16 since such leads are not prone to swinging into the ramp 32. And the cylindrical pin 66 would swing back the leads into the diodes waiting at the load station 22. The cylindrical pin 66 generally is manually extended or retracted, but it may be coupled to an air cylinder if desired.

It should be noted that the ramp 32 and the cylindrical pin 66 are merely examples of the type of abutments which can be used to swing the diode leads 14 and 16 into a testing position. Any other configuration of abutment which could guide the diode into the proper testing position would suffice. For example, the cyindrical pin 66 could be eliminated altogether when handling short leaded diodes 10 by changing the configuration of the ramp 32 to contact the leads 14 and 16 shortly after they leave the load station 22.

A pair of photoelectric transmitter-receiver stations 68-70 and 72-74 are located on the guide track 62 to monitor the position of the transfer table 28 by sensing the presence or absence of the extension 60 of the transfer table. When the transfer table 28 is in the load position, the extension 60 interrupts the beam of light between the transmitter 68 and the receiver 70. When the transfer table 28 is in the test position extension 60 interrupts the light between the transmitter 72 and the receiver 74.

Test Station

Figure 4:
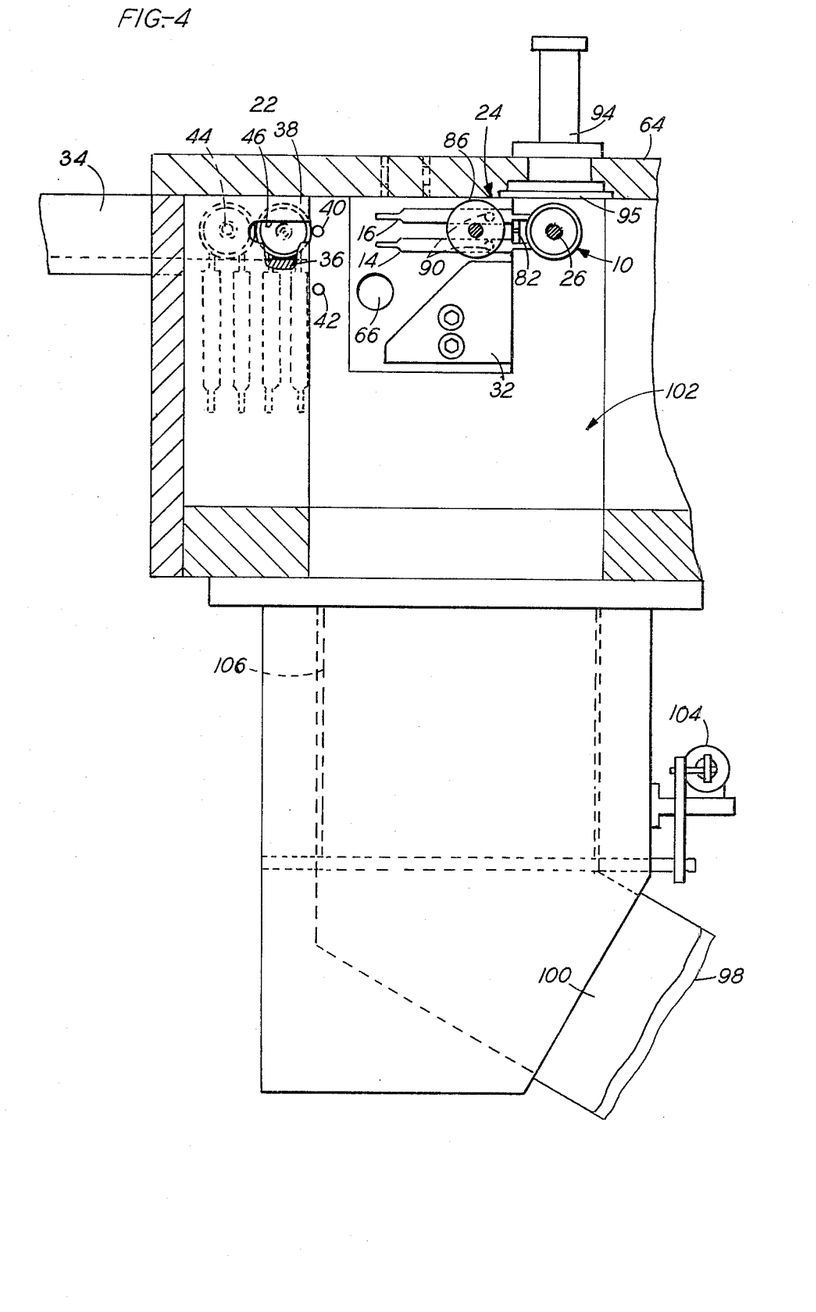
FIG. 4 is a front elevational view also taken along lines 3—3 of FIG. 2, showing a diode at the test station in accordance with the present invention.

Referring now to FIG. 4, the diode 10 is shown in the test position at the test station 24. In this position, the body portion 18 has passed beyond the edge of the ramp 32 and has been pressed into a recess 78 in the wall 30. This allows the leads 14 and 16 to be relatively flat against the wall 30 while they are between the flattened top 63 of the ramp 32 and the cover plate 64.

To insure a final exact alignment for testing, a centering element 82 is extended between the leads 14 and 16 and then retracted before the test is made. The centering element 82 is tapered to a point so that a misaligned lead rides smoothly along it as it extends outward. An air cylinder 84 similar to air cylinders 48, 50, 52 and 54 is used to activate the centering element 82. It should be noted that the centering element 82 may be in the form of a fork engaging one lead rather than a tapered pin inserted between both leads.

After the centering element 82 has given the leads 14 and 16 their final adjustment, a pressing element 86 mounted next to the carrier pin 26 on the transfer table 28 extends outward against the leads 14 and 16. This presses the leads 14 and 16 firmly against test head position 88 of the wall 30. An air cylinder 87 similar to the air cylinder 84 controls the pressing element 86. Any insulating material can be used for the pressing element 86.

A set of contacts 90 are recessed in the test head 88. Once the leads 14 and 16 are held firmly against the test head 88, the contacts 90 move forward through the test head into engagement with the leads. In this manner the leads are sandwiched between the test contacts 90 and the pressing element 86. An air cylinder 92, similar to the air cylinder 84, moves forward the test contacts 90. It should be noted that although this is the preferred method of contacting the leads, the test contacts may also be placed directly on the pressing element 86.

With the test contacts 90 in position against the leads 14 and 16, the LED chip 12 is energized to light. A photocell 94 coupled to a glass window 95 in the cover plate 64 measures the amount of light coming from the diode 10. This light measurement along with any other measurements taken from the test contacts 90 is coupled to a test set 96. This set 96 may be any conventional model suitable for determining whether the light output and other parameters of the test diode 10 are satisfactory or unsatisfactory. By way of example, typical tests for light-emitting diodes are the forward current at a predetermined voltage, the forward voltage at a predetermined current and the light output at a predetermined current or a predetermined voltage.

Sorting Operation

Figure 5:
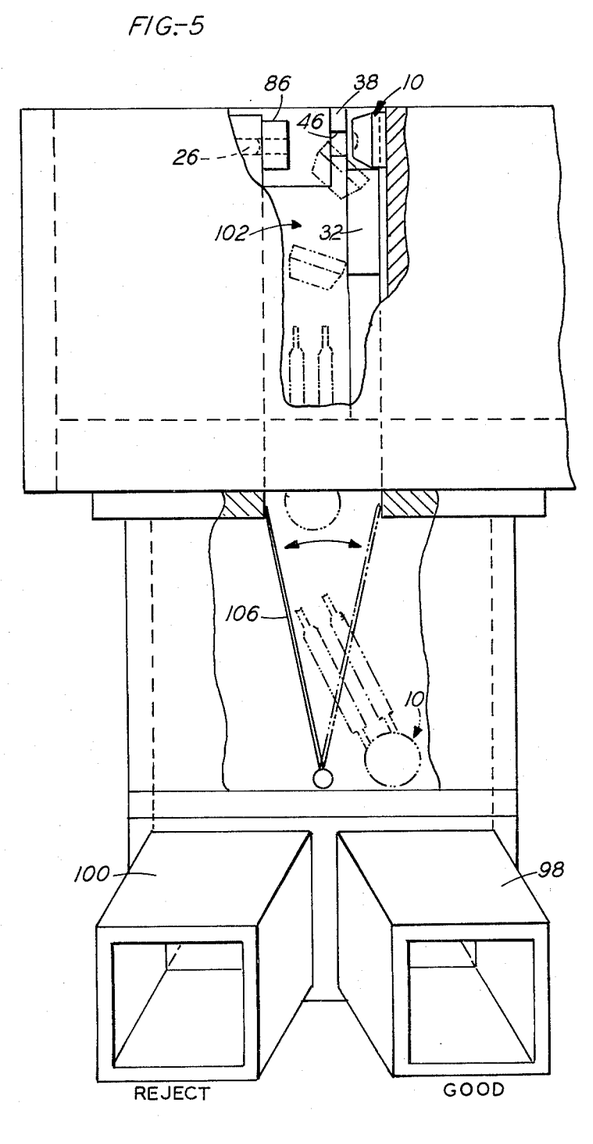
FIG. 5 is side elevational view, taken along lines 5—5 of FIG. 2 showing a sorting operation in accordance with the present invention.

Referring now to FIG. 5, a sorting mechanism is shown for directing a diode 10 into a good bin 98 or a reject bin 100 both of which are located below the ramp 32. An opening 102 alongside the ramp 32 provides a passageway between the ramp and the bins 98 and 100.

After the test has been completed, an air cylinder 104 activates a bin flap 106 located in the opening 102 to point toward the good bin 98 if the diode 10 satisfactorily passes the test. The carrier pin 26 and the pressing element are 86 then withdrawn from the diode 10. The diode 10 is now resting by its leads on ramp 32 with no other support. By virtue of the body portion 18 being off of the ramp 32 and the extended contacts 90 now pushing the leads 14 and 16 away from the wall 30, the diode 10 tumbles forward into an opening 102 alongside the ramp 32. As the diode 10 falls through the opening 102, it strikes the bin flap 106 and falls into the good bin 98.

If the diode 10 failed to pass the test, the bin flap 100 remains in its reject position conveying the diode 10 toward the reject bin 100. When the diode 10 then falls through the opening 102, it strikes the bin flap 106 and is directed into reject bin 100.

Although the diodes 10 generally tumble off the ramp 32 by virtue of their own configuration after the carrier pin 26 and the pressing element 86 are removed, air jets (not shown) can be directed against the leads 14 and 16 through the test head 88 to give the diodes further impetus to leave the ramp if necessary.

Control Circuit

Figure 6:
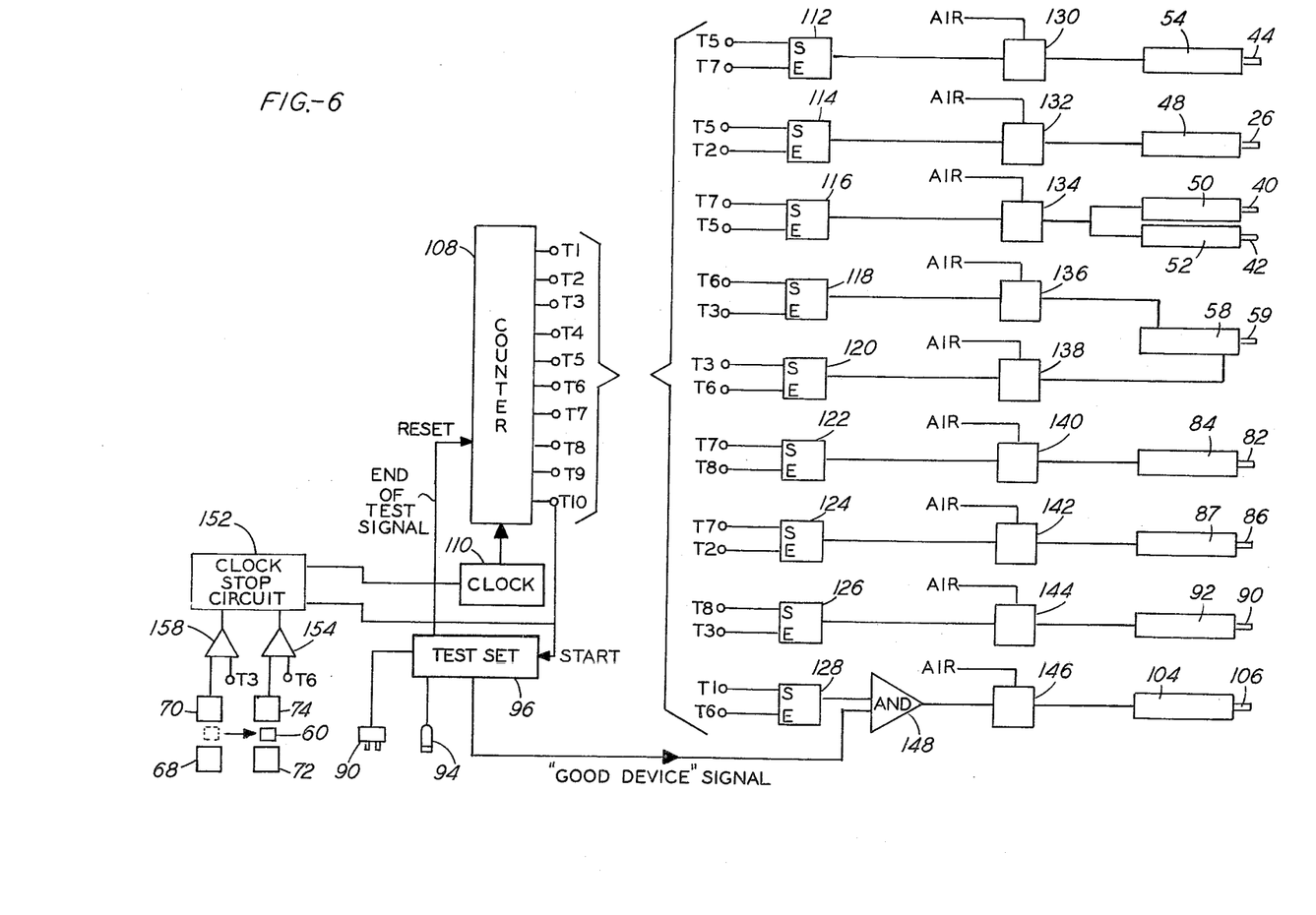
FIG. 6 is a schematic electromechanical diagram showing a control circuit in accordance with the present invention.

FIG. 6 shows a preferred embodiment of a control circuit for controlling the operation of the apparatus of the invention. More particularly a counter 108 coupled to a clock 110 serves as the basic timing unit for activating the various air cylinders at the proper time. The counter 108 counts from times $T_1$ to $T_{10}$ and holds at $T_{10}$ until it is reset. Typically, there is approximately 100 ms. between each count. Commercially available units such as the CD4017AL counter and the CD4001AL clock manufactured by RCA Corporation may be used for the counter 108 and the clock 110, respectively.

Time $T_{10}$ is used to start the operation of the test set 96. The counter then holds until such time as the test set sends the "end of test" signal. This "end of test" signal activates the reset of the counter 108 thereby setting it back to time $T_1$. The times $T_1$ to $T_9$ are used to control the various air cylinders to bring the diode 10 to the proper test position at time $T_{10}$.

The outputs of the counter 108 are coupled to a plurality of static latch circuits 112, 114, 116, 118, 120, 122, 124, 126 and 128. Each of these latch circuits has a start terminal S, an end terminal E, and an output terminal. When the start terminal S of one of the latch circuits is activated by a signal from the counter 108, the latch circuit gives an output. This output lasts until such time as the end terminal E is activated by another signal from the counter 108. The times from the counter 108 for which each of these latch circuits will have their start and end terminals activated are shown. By way of example, the latch circuits can be the Model CD4043AD made by RCA Corporation.

The outputs of each of the latch circuits 112, 114, 116, 118, 120, 122, 124, 126 and 128 are respectively coupled to air valves 130, 132, 134, 136, 138, 140, 142, 144 and 146. Generally, a driving amplifier (not shown) is used to interface each latch circuit to its respective air valve. Each of these valves is also coupled to a source of pressurized air, for example, 50 psi. The air valves prevent the air from passing through the valve except during such time as the air valve receives the output of the latch circuit. Thus, the air valves only pass air at the time which the counter has activated the respective latch circuit to give an output. Examples of air valves which are commercially available for such purposes are Model EV-3-12 made by the Clippard Corporation.

For purposes of clarity, the operation of the control circuit will now be described starting with the loading station. This requires the counter 108 to be stepped off to the output time $T_5$. At the time $T_5$, the latch circuit 112 is activated by the counter 108 by receiving a pulse on its start terminal. The latch circuit 112, in turn, activates the air valve 130 thereby allowing pressurized air to pass through the valve 130 to the air cylinder 54. This causes the air cylinder 54 to push out the stack hold pin 44 thereby pushing a diode 10 against the plate 38.

Simultaneously at time $T_5$, the latch circuit 114 is activated to pass air through the air valve 132. This allows air to pass to the air cylinder 48 which extends the carrier pin 26 into contact with the diode 10 waiting at the escapement pins 40 and 42. As this carrier pin 26 is entering the indentation of the diode 10, the escapement pins 40 and 42 are being withdrawn by virtue of the time $T_5$ pulse from the counter 108 activating the end terminal of the latch circuit 116.

As a result of the time signal $T_5$, the stack of diodes is held in place, the first diode in the stack is held by the carrier pin 26, and the escapement pins are drawn back. The first diode 110 is now ready to begin the transfer operation.

At the time $T_6$, a pulse is sent to the start terminal of the latch circuit 118 and the end terminals of the latch circuits 120 and 128. Activating the start terminal of latch circuit 118 allows the air valve 136 to pass air to a port 148 of the dual-acting air cylinder 58, which drives the transfer table 28 to the right towards the test station 24. By activating the end terminal of the latch circuit 120, air is no longer allowed to pass through the valve 138. The air valve 138 is coupled to a port 150 of the dual-acting cylinder 58 which drives the transfer table 28 to the left toward the load station 22. Since no air is passing through the air valve 138, the table 28 is be driven toward the test station 24 without resistance from air passing through the valve 138.

The $T_6$ signal on the end terminal of the latch circuit 128 closes the air valve 146 to prevent air from passing to the air cylinder 104. This causes the bin flap 106 to return to its reject position if it had previously been in the good bin position.

To provide sufficient time for the transfer table 28 to move to the testing station 24, a clock stop circuit 152 is coupled to the clock 110. This clock stop circuit 152 disables the clock 110 and thereby stops the counter at the $T_6$ count until the transfer table arrives at the test station 24. The clock stop circuit 152 may be any commercially available logic circuit such as the CD4011AE manufactured by RCA Corporation. The gates of such a logic circuit are coupled to a logic gate in the clock 110 to disable the clock upon an output from the clock stop circuit 152.

The clock stop circuit 152 is activated by an AND gate 154. The time $T_6$ provides one input to the AND gate 154. The other input of the AND gate 154 is a signal from the photoelectric receiver 74. This photoelectric receiver 74 only gives an output when the transfer table 28 is out of the test position since the pin 76 blocks light to the receiver when the table reaches the test position. Therefore, the clock stop circuit 152 only stops the counter through the AND gate 154 when both the $T_6$ time signal and the photoelectric receiver 76 signal are present at the AND gate inputs. Once the transfer table 28 arrives at the test position, the photoelectric receiver 74 signal is blocked and the counter resumes counting.

To prepare the diode 10 for testing, the start terminals of latch circuits 122 and 124 are activated at time $T_7$. This allows air to pass through the air valves 140 and 142, respectively. The air valve 140 is coupled to the air cylinder 84 which drives the centering element 82 outward between the leads 14 and 16 of the diode 10. The air valve 142 is coupled to the air cylinder 87 which drives the pressing element 86 into contact with the leads 14 and 16. Generally, it is desirable to locate the centering element 82 closer to the leads 14 and 16 than the pressing element 86 at the time of activating cylinders 84 and 87. This allows the centering element 82 to reach the leads 14 and 16 before the pressing element 86, thereby allowing the centering element to fulfill its function before the pressing element clamps the leads. However, it has been found that the centering element 82 can actually align the leads 14 and 16 even after the pressing element 86 has engaged them.

Meanwhile at time $T_7$, the loading station is prepared for the next cycle. The end, the end terminal of latch circuit 112 is activated, thereby shutting off the air supply at the valve 130. This cuts off the air supply to the air cylinder 54 and withdraw the stack hold pin 44. At the same time $T_7$ the start terminal of the latch circuit 117 is activated. This allows air to pass through the air valve 134, thereby activating air cylinder 50 and 52 to drive out the escapement pin 40 and 42. Since the stack hold pin 44 is withdrawn and the escapement pins 40 and 42 are extended, the diode 10 which the stack pin had previously been holding is moved forward against the escapement pins 40 and 42.

The diode 10 at the test station 24 is now in position for testing. Therefore, at time $T_8$ the start terminal of latch circuit 126 is activated. This allows air to pass through the air valve 142 to the air cylinder 92 which the test contacts 90 forward. Simultaneously, the end terminal of latch circuit 122 is activated thereby cutting off the supply of air to the air cylinder 84 via the air valve 140.

The time $T_9$ is used to insure that the contacts 90 have a sufficient amount of time to come into a good engagement with the leads 14 and 16. As such, the time $T_9$ is desirable but could be eliminated if satisfactory engagement is achieved in the single time period $T_8$.

At time $T_{10}$ the counter 108 activates the test set 96 to begin the test through the test contacts 90. Following the test, an "end of test" signal is sent to reset the counter 108 and a "good device" signal is sent to an input of an AND gate 156 if the diode 10 passes the test.

After the counter 108 has been reset, its $T_1$ pulse activates the start terminal of the latch circuit 128. The output of the latch circuit 128 provides the other input to the AND gate 156. If the AND gate 156 receives both a signal from the latch circuit 128 and a "good device" signal from the test set 96, it will activate the air valve 146. This allows air to pass to the air cylinder 104 thereby moving the bin flap 106 into its good bin position.

Upon counting time $T_2$, the end terminals of latch circuit 114 and 124 is activated. The latch circuit 114 then causes the carrier pin 26 to be withdrawn from the just tested diode 10 by cutting off the air supply to cylinder 48 via air valve 132. The pressing element 86 is withdrawn since latch circuit 124 deactivates the air cylinder 87 via the air valve 142. At this point in time the just tested diode 10 falls into the opening 102 as previously described.

The apparatus is now ready to begin reloading for a new test. To that end, the time $T_3$ from the counter 108 simultaneously activates the start terminal of latch circuit 120 and the end terminal of the latch circuit 118. The latch circuit 120 then allows air to pass through the air valve 138 to the port 150 of the dual-acting air cylinder 58. This drives the transfer table to the left toward the load station 22. The latch circuit 118 relieves any air pressure tending to push the transfer table 28 to the right by closing the supply of air to the port 148 of the dual-acting air cylinder 58 through the air valve 136. Also at the time $T_3$ the test contacts are withdrawn by the activation of the end terminal of the latch circuit 126. This cuts off the supply of air to the air cylinder 92 by closing the air valve 144.

The clock stop circuit 152 is also activated to stop the counter 108 at the $T_3$ count to allow sufficient time for the transfer table 28 to return to the load position. To this end, an AND circuit 158 activates the clock stop circuit 152 when it receives both the $T_3$ signal and a signal from the photoelectric receiver 70. As previously described, the signal from the photoelectric receiver 70 is only present when the transfer table is out of the load position so that the pin 76 will not block the light to the receiver 70.

After the clock stop circuit 152 allows the counter 108 to resume counting, it counts through the step $T_4$ and begins the load operation all over again at the time $T_5$. The time $T_4$ is used to allow the transfer table 28 to settle into the load position. As such it is desirable, but not necessary.

Although the control circuit for this invention has been shown as a counter 108 coupled to a plurality of latch circuits, it is to be understood that other forms of control circuits could be used without departing from the spirit of the invention. For example, a commercially available microprocesser such as the Intel 4040 or a minicomputer may be programmed to control the air valves and air cylinders in the same manner as the above-described control circuit.

Similarly, although air cylinders and air valves have been shown as the means to control movement of the various pins used in the operation of the invention, other means could be used. For example, the pins may be moved by electrical solenoids.

Furthermore, although the invention has been described in terms of swinging the diode 10 into a horizontal testing position, other positions could be used. Thus, the particular angle into which the leads are moved is not critical so long as the abutment brings the leads into approximate alignment with the test contacts.

It should, of course, be noted that the use of this invention is not intended to be limited to transporting and testing light-emitting diodes. On the contrary, the invention can be used for transferring and orienting any article which has an indentation and an extending portion.

It is to be understood that the above-described arrangements are simply illustrative of the application of the principles of this invention. Numerous other arrangements may be readily devised by those skilled in the air which embody principles of the invention and fall within its spirit and scope.

What is claimed is:

1. A method of transporting, orienting and testing an electronic component having a body portion, at least one lead extending from the body portion, and an indentation, said method comprising:
   placing a pin into the indentation of the electronic component when at least one lead is extending approximately vertically downward, thereby holding the component movably against a substantially flat surface having an abutment mounted to said surface; and
   moving the pin to a test station thereby sliding the component along the surface to contact the vertically downward lead of the component with the abutment to pivot the component about the pin to position the lead which was vertically downward into a substantially horizontal orientation at the test station; and
   engaging the lead with testing contacts at the test station to perform a test on the component.

2. A method of testing a light-emitting diode encapsulated in a transparent lens, the lens having an indentation for scattering light emitted from the diode, and at least one lead extending from the diode and through the lens for coupling to external elements, the method comprising:
   placing a pin into the indentation of the transparent lens to hold the component movably against a substantially flat surface having an abutment mounted to said surface;
   moving the pin to a test station thereby sliding the diode along the surface to contact at least one lead with the abutment to pivot the lens about the pin to position the lead into a predetermined orientation at the test station; and
   engaging the lead with testing contacts at the test station to perform a test on the diode.

3. The method of claim 2, further comprising pressing the lead against the test contacts of the test station after the lead has been rotated into its predetermined orientation.

4. The method of claim 2, further comprising engaging at least one lead with a centering element after the diode has been pivoted to insure proper alignment of the lead with the test contacts.

5. An apparatus for transporting, orienting and testing an electronic component having a body portion, at least one lead extending from the body portion, and an indentation, said apparatus comprising:
   a substantially flat, essentially vertical surface having an abutment mounted to said surface;
   a table located adjacent to said surface;
   a pin mounted on said table;
   means for moving the pin outward from the table into the indentation of the component to hold the component movably against the surface;
   means for moving the table and the pin to a test station thereby sliding the component along the surface to contact at least one lead of the component with the abutment to pivot the component about the pin to position the lead of the component in a predetermined orientation at the test station;
   test contacts located at the test station; and
   means to engage the test contacts with the lead to perform a test on the component after the lead has been positioned at the test station.

6. An apparatus for testing a light-emitting diode encapsulated in a transparent lens, the lens having an indentation for scattering light emitted from the diode, and at least one lead extending from the diode and through the lens for coupling to external elements, the apparatus comprising:
   a substantially flat surface having a first abutment mounted to said surface;
   a table located adjacent to said surface;
   a pin mounted on said table;
   means for moving the pin outward from the table into the indentation of the transparent lens to hold the diode movably against the surface;
   means for moving the table and the pin to the test station thereby sliding the diode along the surface to contact at least one lead with the first abutment to pivot the lens about the pin to position the lead in a predetermined orientation at the test station;
   test contacts located at the test station; and
   means to engage the test contacts with the lead to perform a test on the diode after the lead has been positioned in its predetermined orientation.

7. The apparatus of claim 6, further comprising:
   a plunger mounted on the table adjacent to the pin; and
   means for moving the plunger outward from the table to engage the lead and press it against the test contacts of the test station after the lead has been rotated into its predetermined orientation.

8. The apparatus of claim 6, further comprising:
   a centering element located at the test station; and
   means for engaging the centering element with at least one lead after the diode has been pivoted to insure proper alignment of the lead with the test contacts.

9. The apparatus of claim 6, further comprising: a second abutment located above the first abutment to limit the upward movement of the lead.

* * * * *